United States Patent
Mishima

(10) Patent No.: US 10,818,863 B2
(45) Date of Patent: Oct. 27, 2020

(54) ORGANIC ELECTROLUMINESCENT ELEMENT, ORGANIC ELECTROLUMINESCENT UNIT, AND ELECTRONIC APPARATUS

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/124,195

(22) Filed: Sep. 7, 2018

(65) Prior Publication Data

US 2019/0131558 A1 May 2, 2019

(30) Foreign Application Priority Data

Oct. 27, 2017 (JP) .................. 2017-208272

(51) Int. Cl.
*H01L 51/50* (2006.01)
*H01L 51/52* (2006.01)

(52) U.S. Cl.
CPC ........ *H01L 51/508* (2013.01); *H01L 51/5092* (2013.01); *H01L 51/5265* (2013.01); *H01L 51/5234* (2013.01)

(58) Field of Classification Search
CPC ............... H01L 51/508; H01L 51/5092; H01L 51/5265; H01L 51/5234; H01L 51/0087; H01L 51/5024; H01L 51/5036; H01L 51/509; H01L 51/5206; H01L 51/5221; H01L 51/5271

USPC .......................................................... 257/40
See application file for complete search history.

(56) References Cited

U.S. PATENT DOCUMENTS

| | | | |
|---|---|---|---|
| 7,192,659 B2* | 3/2007 | Ricks | H01L 51/5036 257/98 |
| 2004/0174321 A1 | 9/2004 | Takei | |
| 2005/0001540 A1 | 1/2005 | Burroughes et al. | |
| 2005/0233166 A1 | 10/2005 | Ricks et al. | |
| 2007/0020483 A1* | 1/2007 | Park | H01L 51/508 428/690 |
| 2007/0020484 A1* | 1/2007 | Kim | H01L 51/5096 428/690 |
| 2009/0011278 A1 | 1/2009 | Choi et al. | |
| 2011/0309739 A1 | 12/2011 | Song et al. | |
| 2012/0248418 A1 | 10/2012 | Kim et al. | |
| 2013/0076251 A1* | 3/2013 | Lee | H01L 51/5221 315/173 |
| 2015/0008419 A1* | 1/2015 | Li | H01L 51/5016 257/40 |

(Continued)

FOREIGN PATENT DOCUMENTS

| CN | 19443057 A | 4/2007 |
|---|---|---|
| CN | 102738194 A | 10/2012 |

(Continued)

*Primary Examiner* — Cuong Q Nguyen
(74) *Attorney, Agent, or Firm* — Hauptman Ham, LLP

(57) ABSTRACT

An organic electroluminescent element according to one embodiment of the disclosure includes, in order, an anode, an organic light-emitting layer, an electron transport layer, an intermediate layer, and a cathode. The electron transport layer includes a sodium fluoride layer. The intermediate layer includes an ytterbium layer. The ytterbium layer is in contact with the sodium fluoride layer on side of the cathode.

17 Claims, 7 Drawing Sheets

(56) References Cited

U.S. PATENT DOCUMENTS

| | | | | |
|---|---|---|---|---|
| 2015/0144896 A1* | 5/2015 | Joo | ............. | H01L 51/5016 |
| | | | | 257/40 |
| 2015/0144897 A1* | 5/2015 | Kang | ............. | H01L 51/5076 |
| | | | | 257/40 |
| 2016/0133880 A1* | 5/2016 | Lee | ............. | H01L 51/5281 |
| | | | | 257/40 |
| 2016/0172620 A1 | 6/2016 | Hashimoto et al. | | |
| 2016/0172628 A1 | 6/2016 | Hashimoto et al. | | |
| 2017/0012231 A1 | 1/2017 | Mishima et al. | | |
| 2017/0309852 A1* | 10/2017 | Seo | ............. | H01L 51/5004 |

FOREIGN PATENT DOCUMENTS

| | | |
|---|---|---|
| CN | 104183720 A | 12/2014 |
| CN | 105590948 A | 5/2016 |
| JP | 2004288621 A | 10/2004 |
| JP | 2005-310803 A | 11/2005 |
| JP | 2007-36175 A | 2/2007 |
| JP | 2008-251552 A | 10/2008 |
| JP | 2009-16332 A | 1/2009 |
| JP | 2012-4116 A | 1/2012 |
| JP | 2012-59709 A | 3/2012 |
| JP | 2016115717 A | 6/2016 |
| JP | 2016115718 A | 6/2016 |
| JP | 2017-22369 A | 1/2017 |

\* cited by examiner

| | | | EMBOD-IMENT | MODIFI-CATION EXAMPLE A | MODIFI-CATION EXAMPLE B | MODIFI-CATION EXAMPLE C | MODIFI-CATION EXAMPLE D |
|---|---|---|---|---|---|---|---|
| CATHODE 17 | 17C | An ytterbium cap layer | | | | | |
| | 17B | A reflective metal layer | Ag,MgAg,Al etc. | | | | |
| | 17A | A translucent metal layer | | | | | |
| INTER-MEDIATE LAYER 16 | 16D | An ytterbium film quality adjusting layer | | | | | Yb (0.1-3nm) |
| | 16B | A film thickness adjusting layer | | ITO or IZO (>40nm) | | | |
| | 16C | A silver under layer | | | | Ag (0.1-10nm) | |
| | 16A | A ytterbium layer | Yb (0.1-10nm) | Yb (>1nm) | Yb (0.1-10nm) | | Yb (>1nm) |
| ELECTRON TRANSPORT LAYER 15 | | A sodium fluoride layer | NaF (0.1-20nm) | | | | |

FIG. 5

| | | | MODIFI-CATION EXAMPLE E | MODIFI-CATION EXAMPLE F | MODIFI-CATION EXAMPLE G | MODIFI-CATION EXAMPLE H |
|---|---|---|---|---|---|---|
| CATHODE 17 | 17C | An ytterbium cap layer | | | | Yb (0.1-3nm) |
| | 17B | A reflective metal layer | Ag,MgAg,Al etc. | | | |
| | 17A | A translucent metal layer | | | | |
| INTER-MEDIATE LAYER 16 | 16D | An ytterbium film quality adjusting layer | | | Yb (0.1-3nm) | EMBOD-IMENT MODIFI-CATION EXAMPLES A to G |
| | 16B | A film thickness adjusting layer | | ITO or IZO (>40nm) | | |
| | 16E | The metal-doped organic material layer | Yb-DOPED ORGANIC MATERIAL (5-50nm, 5-60wt%) | | | |
| | 16A | A ytterbium layer | Yb (0.1-10nm) | | | |
| ELECTRON TRANSPORT LAYER 15 | | A sodium fluoride layer | NaF (0.1-20nm) | | | |

FIG. 6

ORGANIC ELECTROLUMINESCENT ELEMENT, ORGANIC ELECTROLUMINESCENT UNIT, AND ELECTRONIC APPARATUS

CROSS REFERENCE TO RELATED APPLICATIONS

This application claims the benefit of Japanese Priority Patent Application No. 2017-208272 filed on Oct. 27, 2017, the entire contents of which are incorporated herein by reference.

BACKGROUND

The disclosure relates to an organic electroluminescent element, an organic electroluminescent unit, and an electronic apparatus.

A variety of organic electroluminescent units, such as organic electroluminescent displays, including organic electroluminescent elements have been proposed. Reference is made to Japanese Unexamined Patent Application Publication (JP-A) Nos. 2012-059709, 2007-036175, 2012-004116, 2009-016332, 2005-310803, 2008-251552, and 2017-022369, for example.

SUMMARY

An organic electroluminescent unit has been requested to improve light emission characteristics and a service life of an organic electroluminescent element.

It is desirable to provide an organic electroluminescent element, an organic electroluminescent unit, and an electronic apparatus that make it possible to improve light emission characteristics and a service life.

An organic electroluminescent element according to an embodiment of the disclosure includes, in order, an anode, an organic light-emitting layer, an electron transport layer, an intermediate layer, and a cathode. The electron transport layer includes a sodium fluoride layer. The intermediate layer includes an ytterbium layer. The ytterbium layer is in contact with the sodium fluoride layer on side of the cathode.

An organic electroluminescent unit according to an embodiment of the disclosure includes a plurality of organic electroluminescent elements. One or more of the organic electroluminescent elements include, in order, an anode, an organic light-emitting layer, an electron transport layer, an intermediate layer, and a cathode. The electron transport layer includes a sodium fluoride layer. The intermediate layer includes an ytterbium layer. The ytterbium layer is in contact with the sodium fluoride layer on side of the cathode.

An electronic apparatus according to an embodiment of the disclosure includes an organic electroluminescent unit. The organic electroluminescent unit includes a plurality of organic electroluminescent elements. One or more of the organic electroluminescent elements include, in order, an anode, an organic light-emitting layer, an electron transport layer, an intermediate layer, and a cathode. The electron transport layer includes a sodium fluoride layer. The intermediate layer includes an ytterbium layer. The ytterbium layer is in contact with the sodium fluoride layer on side of the cathode.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 5 illustrates an exemplary configuration of each of an electron transport layer, an intermediate layer, and a cathode in an embodiment and various modification examples.

FIG. 6 illustrates an exemplary configuration of each of an electron transport layer, an intermediate layer, and a cathode in various modification examples.

DETAILED DESCRIPTION

Figure 1:
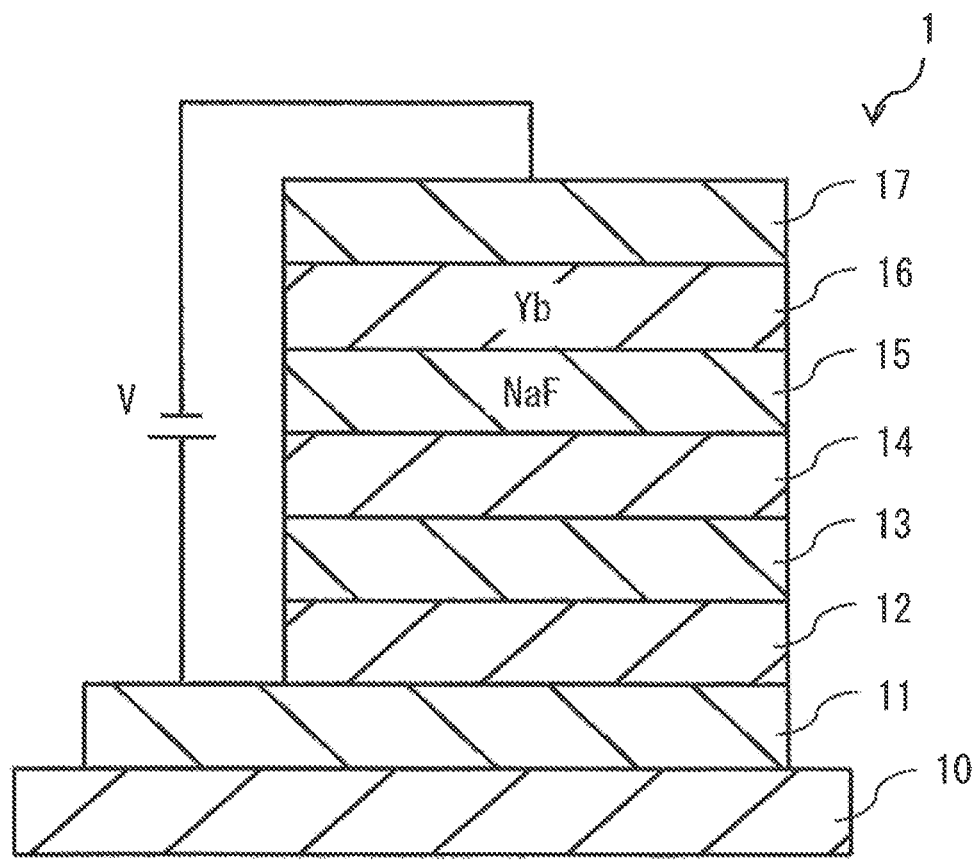
FIG. 1 illustrates an exemplary cross-sectional configuration of an organic electroluminescent element according to one embodiment of the disclosure.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Organic Electroluminescent Element)
2. Modification Example of First Embodiment (Organic Electroluminescent Element)
3. Second Embodiment (Organic Electroluminescent Unit)
4. Application Examples (Electronic Apparatus and Illumination Apparatus)

1. First Embodiment

[Configuration]

FIG. 1 illustrates an exemplary cross-sectional configuration of an organic electroluminescent element 1 according to a first embodiment of the disclosure. The organic electroluminescent element 1 may be on a substrate 10, for example. The organic electroluminescent element 1 has an element structure in which the organic electroluminescent element 1 includes, for example, an anode 11, a hole injection layer 12, a hole transport layer 13, an organic light-emitting layer 14, an electron transport layer 15, an intermediate layer 16, and a cathode 17, in this order from side of the substrate 10. The hole injection layer 12 and the hole transport layer 13 may be provided on hole-injection side of the organic light-emitting layer 14, and the electron transport layer 15 and the intermediate layer 16 may be provided on electron-injection side of the organic light-emitting layer 14. The organic electroluminescent element 1 may further include any other functional layer, for example, an electron injection layer. Further, one or both of the hole injection layer 12 and the hole transport layer 13 may be omitted in the organic electroluminescent element 1.

In the present example embodiment, the organic electroluminescent element 1 may have a microcavity structure in some cases. The microcavity structure may have, for example, an effect of strengthening light of a specific wavelength by utilizing light resonance generated between the anode 11 and the cathode 17. Light outputted by the organic light-emitting layer 14 is subjected to multiple reflection between the anode 11 and the cathode 17. At this occasion, light of a specific wavelength component of the light outputted from the organic light-emitting layer 14 may be strengthened. An optical path length from the anode 11 to the cathode 17 corresponds to a light emission spectrum peak wavelength of the light outputted from the organic light-emitting layer 14. The microcavity structure may allow the light outputted from the organic light-emitting layer 14 to repeat reflection within a range of a predetermined optical length between the anode 11 and the cathode 17. This may strengthen, by resonance, the light of a specific wavelength corresponding to the optical path length, while weakening light of a wavelength not corresponding to the optical path length. As a result, a spectrum of light to be extracted to the outside may be steep and its intensity may be high, thus causing luminance and color purity thereof may be enhanced. Accordingly, a distance from the anode 11 to the cathode 17 may be an optical path length in which the cavity is generated. In the microcavity structure, as a film thickness becomes larger, for example, a primary interference (i.e., a first cavity), a secondary interference (i.e., a second cavity), and a tertiary interference (i.e., a third cavity) may occur.

The substrate 10 may be, for example, a light-transmissive translucent substrate such as a transparent substrate. The substrate 10 may be, for example but not limited to, a glass substrate. Non-limiting examples of a material to be used for the substrate 10 may include non-alkali glass, soda glass, non-fluorescent glass, phosphate glass, borate glass, and quartz. Note that the substrate 10 is not limited to the glass substrate, but may be a translucent resin substrate or a thin-film transistor (TFT) substrate that is to be a backplane of an organic electroluminescent (EL) display unit. Non-limiting examples of a material of the translucent resin substrate to be used for the substrate 10 may include acrylic resin, styrene resin, polycarbonate resin, epoxy resin, polyethylene, polyester, and silicone resin. The substrate 10 may be either a highly flexible substrate or a highly rigid substrate with almost no flexibility.

The anode 11 may be on the substrate 10, for example. The anode 11 may be a reflective electrode having light reflectivity. The reflective electrode having light reflectivity corresponds to a specific but non-limiting example of a "reflective metal layer" according to one embodiment of the disclosure. Non-limiting examples of a material of the reflective electrode may include aluminum (Al), silver (Ag), and an alloy of aluminum or silver. Note that the anode 11 is not limited to the reflective electrode, but may be, for example, a transparent electrode having translucency. Non-limiting examples of a material of the transparent electrode may include a transparent electrically-conductive material, such as indium tin oxide (ITO) and indium zinc oxide (IZO). The anode 11 may be a laminate of the reflective electrode and the transparent electrode.

The hole injection layer 12 may serve to inject, to the hole transport layer 13 and the organic light-emitting layer 14, holes injected from the anode 11. The hole injection layer 12 may be configured by an inorganic material having a hole injection property, for example. Non-limiting examples of the inorganic material having a hole injection property may include oxides (i.e., inorganic oxides) of silver (Ag), molybdenum (Mo), chromium (Cr), vanadium (V), tungsten (W), nickel (Ni), and iridium (Ir). The hole injection layer 12 may be configured by a vapor-deposited film or a sputtered film of the inorganic oxide, for example. Note that the hole injection layer 12 may be configured by an organic material having a hole injection property. Non-limiting examples of the organic material having a hole injection property may include an electrically-conductive polymer material such as a mixture of polythiophene and polystyrene sulfonate (PEDOT). The hole injection layer 12 may be configured by a coated film of the organic material, for example. The hole injection layer 12 may be configured by a vapor-deposited film or a sputtered film of the organic material.

The hole transport layer 13 may serve to transport, to the organic light-emitting layer 14, holes injected from the anode 11. The hole transport layer 13 may be configured by, for example, a material (i.e., a hole transporting material) that serves to transport, to the organic light-emitting layer 14, holes injected from the anode 11. Non-limiting examples of the hole transporting material may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof.

The organic light-emitting layer 14 may serve to emit light of a predetermined color through recombination of holes and electrons. The organic light-emitting layer 14 may include an organic light-emitting material that emits light through generation of excitons caused by recombination of holes and electrons. For example, the organic light-emitting layer 14 may be a coated film that is coated with a solution by application and drying of the solution. The solution may mainly contain the above-described organic light-emitting material as a solute. The organic light-emitting layer 14 may be configured by a vapor-deposited film.

The organic light-emitting layer 14 may be, for example, configured by a single-layered light-emitting layer or a laminate of a plurality of organic light-emitting layers. In a case where the organic light-emitting layer 14 is configured by the laminate of the plurality of organic light-emitting layers, the plurality of organic light-emitting layers may include a common main component of the above-described organic light-emitting material, for example.

The organic light-emitting material that is the (raw) material of the organic light-emitting layer 14 may be, for example but not limited to, a combination of a host material and a dopant material. The organic light-emitting material that is the (raw) material of the organic light-emitting layer 14 may be a single dopant material. The host material may mainly serve to transport charges such as electrons and holes, and the dopant material may serve to emit light. The organic light-emitting material is not only limited to a combination of one host material and one dopant material, but may also be a combination of two or more host materials and two or more dopant materials.

Non-limiting examples of the host material of the organic light-emitting layer 14 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the dopant material of the organic light-emitting layer 14 may include a pyrene derivative, a fluoranthene derivative, an arylacetylene derivative, a fluorene derivative, a perylene derivative, an oxadiazole derivative, an anthracene derivative, and a chrysene derivative. Further, a metal complex may be used as a fluorescent dopant material of the organic light-emitting layer 14. The metal complex may contain, for example, a ligand and an atom of metal, such as iridium (Ir), platinum (Pt), osmium (Os), gold (Au), rhenium (Re), or ruthenium (Ru).

The electron transport layer 15 may serve to transport, to the organic light-emitting layer 14, electrons injected from the cathode 17. The electron transport layer 15 may include, for example, a material (i.e., an electron transporting material) that serves to transport, to the organic light-emitting layer 14, electrons injected from the cathode 17. The electron transport layer 15 may be configured by a vapor-deposited film or a sputtered film, for example. Non-limiting examples of the above-described electron transporting material may include sodium fluoride (NaF). The electron transport layer 15 may be a NaF layer, for example. The NaF layer used for the electron transport layer 15 may have a film thickness in a range from 0.1 nm to 20 nm, for example.

The intermediate layer 16 may include, for example, a material (i.e., the electron transporting material) that serves to transport, to the organic light-emitting layer 14, electrons injected from the cathode 17. The intermediate layer 16 may be configured by a vapor-deposited film or a sputtered film, for example. Non-limiting examples of the electron transporting material to be used for the intermediate layer 16 may include ytterbium (Yb). The intermediate layer 16 may be, for example, a Yb layer that is in contact with the electron transport layer 15 (e.g., the NaF layer). In other words, in the present example embodiment, there is provided, between the organic light-emitting layer 14 and the cathode 17, a laminated body in which the NaF layer and the Yb layer are in contact with each other and are laminated in this order from side of the organic light-emitting layer 14. The Yb layer used for the intermediate layer 16 may have a film thickness in a range from 0.1 nm to 10 nm, for example. The Yb layer used for the intermediate layer 16 may serve to transport electrons and to reduce the electron transport layer 15 that is in contact with the Yb layer. The Yb layer used for the intermediate layer 16 and having a film thickness of less than 0.1 nm may exhibit insufficient effects, thus leading to a possibility that an electron current amount may be lowered due to insufficient dissociation of NaF. Meanwhile, the Yb layer used for the intermediate layer 16 and having a film thickness of more than 10 nm may lower the transmittance thereof, thus leading to a possibility that light transmission efficiency may be lowered. Further, it is contemplated that the Yb layer used for the intermediate layer 16 may also have an effect of suppressing degradation of dissociated Na because of lower permeability of a substance such as oxygen than that of an organic material used as the intermediate layer 16.

The cathode 17 may be a transparent electrode having translucency. The transparent electrode having translucency corresponds to a specific but non-limiting example of a "translucent metal layer" according to one embodiment of the disclosure. Non-limiting examples of a material of the transparent electrode may include aluminum (Al), magnesium (Mg), silver (Ag), an aluminum-lithium alloy, a magnesium-silver alloy, indium tin oxide (ITO), and indium zinc oxide (IZO). The cathode 17 that serves as the transparent electrode may be, for example, an Al layer, an Mg layer, an Ag layer, an Al—Li alloy layer, or an Mg—Ag alloy layer having a thickness in a range from 5 nm to 30 nm. Note that the cathode 17 is not limited to the transparent electrode, but may be the reflective electrode having light reflectivity. Non-limiting examples of a material of the reflective electrode may include aluminum (Al), magnesium (Mg), silver (Ag), an aluminum-lithium alloy, and a magnesium-silver alloy. The cathode 17 that serves as the reflective electrode may be, for example, an Al layer, an Mg layer, an Ag layer, an Al—Li alloy layer, or an Mg—Ag alloy layer having a thickness in a range from 40 nm to 200 nm. In the present example embodiment, in a case where the substrate 10 and the anode 11 each have reflectivity and the cathode 17 has translucency, the organic electroluminescent element 1 may have a top emission structure in which light is outputted from side of the cathode 17. Note that, in the present example embodiment, in a case where the substrate 10 and the anode 11 each have translucency and the cathode 17 has reflectivity, the organic electroluminescent element 1 may have a bottom emission structure in which light is outputted from the side of the substrate 10.

Figure 2:
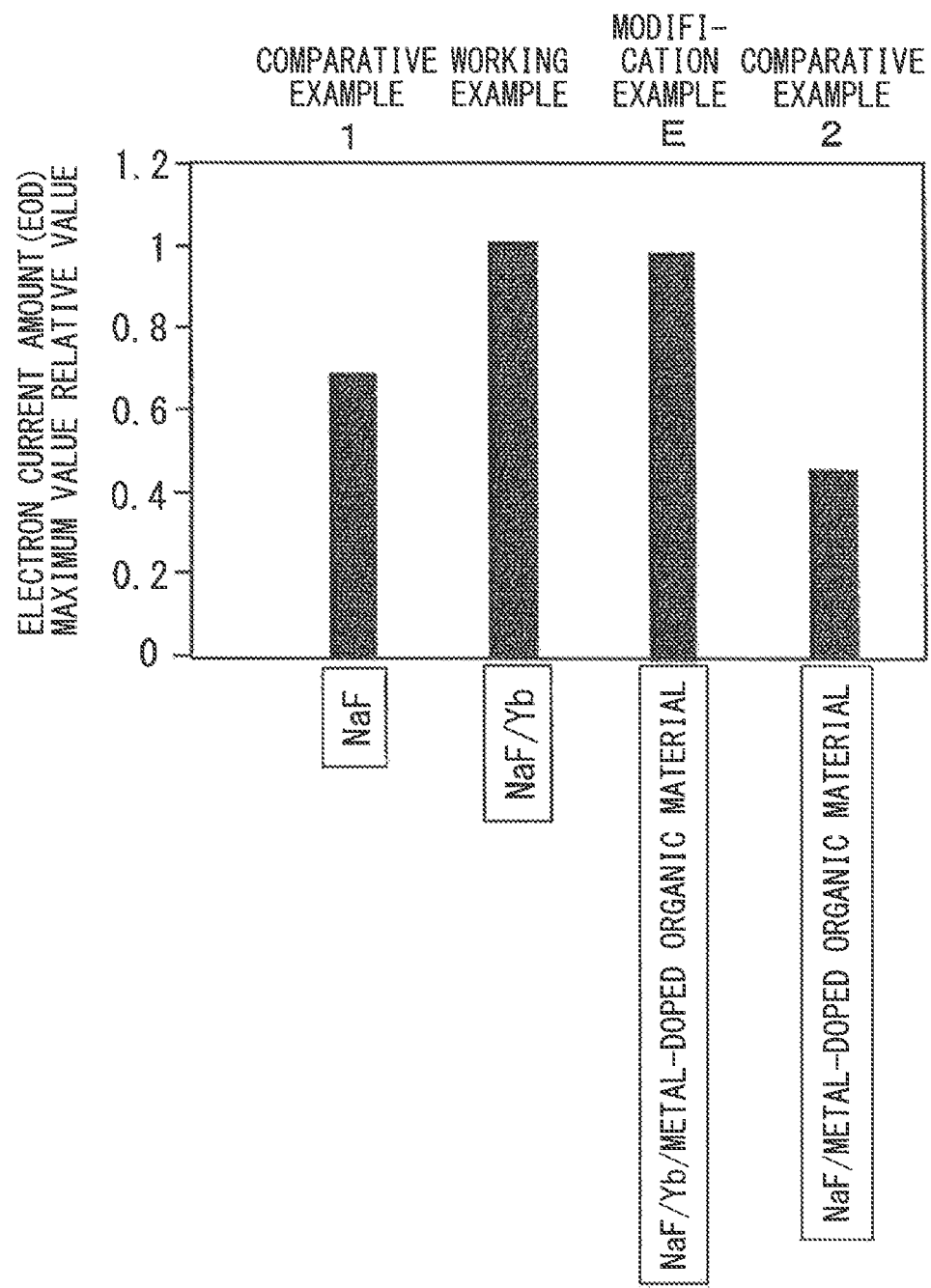
FIG. 2 illustrates an exemplary maximum value of an electron current amount.
Figure 3:
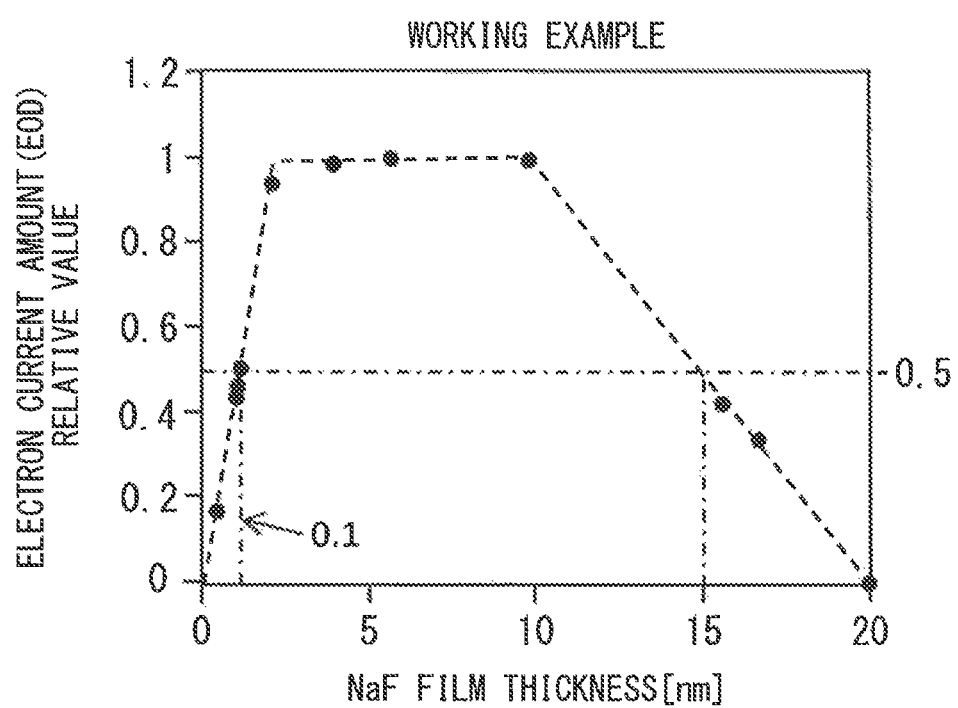
FIG. 3 illustrates exemplary dependency of the electron current amount on a film thickness of NaF.
Figure 4:
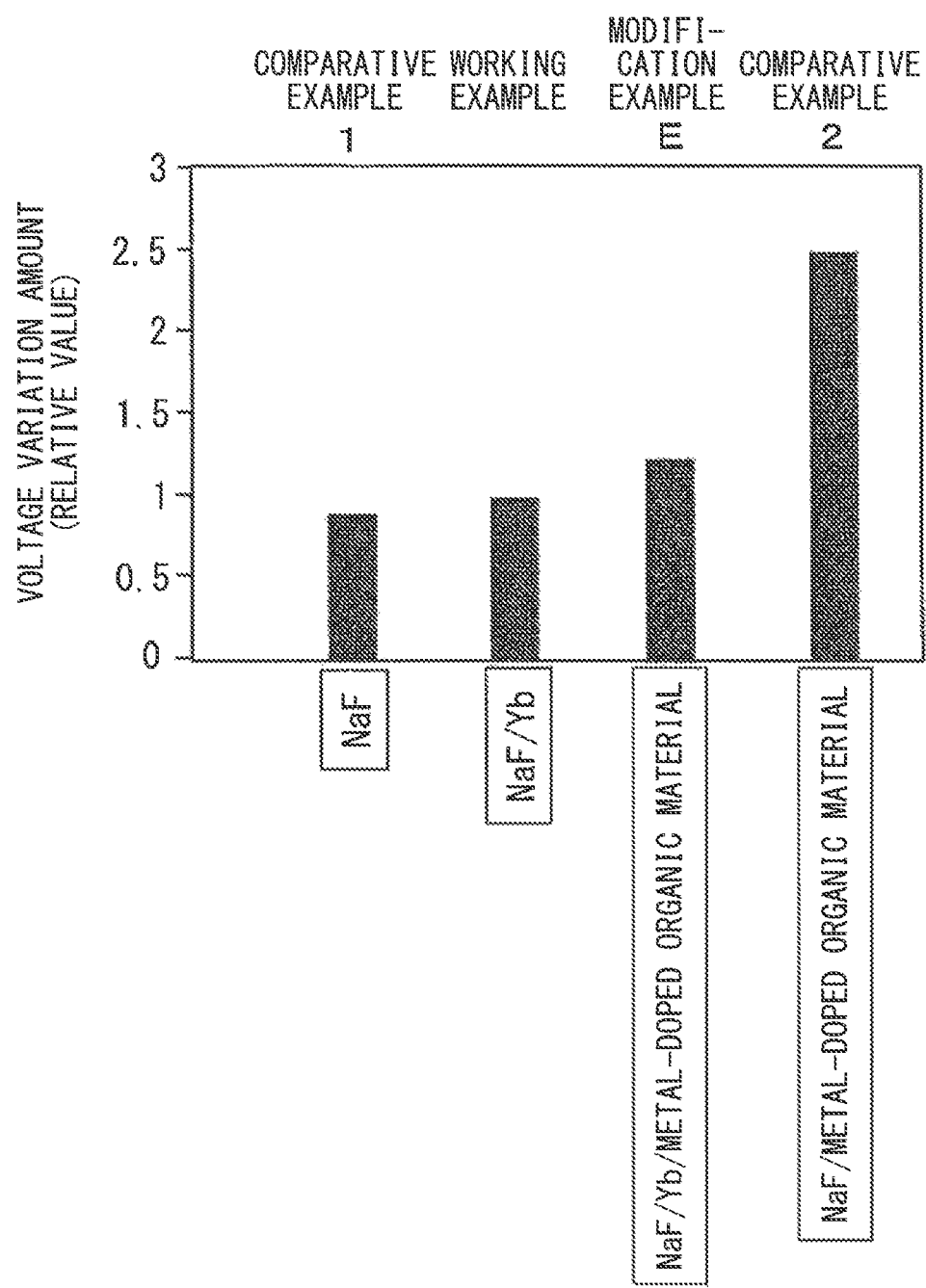
FIG. 4 illustrates an exemplary voltage variation amount.

Description is given next of a feature of the organic electroluminescent element 1 according to the present example embodiment, with reference also to comparative examples. FIG. 2 is an exemplary maximum value of an electron current amount in the organic electroluminescent element. FIG. 3 illustrates exemplary dependency of the electron current amount on a film thickness of NaF in the organic electroluminescent element. FIG. 4 illustrates an exemplary variation amount of a voltage applied to the organic electroluminescent element.

Leftmost data in FIGS. 2 and 4 indicate, respectively, an exemplary maximum value of an electron current amount and an exemplary voltage variation amount (hereinafter, referred to as "data of Comparative Example 1") in an electron-only device (EOD) structure. The leftmost data in FIGS. 2 and 4 are obtained in a situation where the intermediate layer 16 in the present example embodiment is omitted and the electron transport layer (i.e., the NaF layer) and the cathode are in contact with each other. Rightmost data in FIGS. 2 and 4 indicate, respectively, an exemplary maximum value of an electron current amount and an exemplary voltage variation amount (hereinafter, referred to as "data of Comparative Example 2") in the EOD structure. The rightmost data in FIGS. 2 and 4 are obtained in a situation where a layer corresponding to the intermediate layer 16 in the present example embodiment is a metal-doped organic material layer and the metal-doped organic layer is provided between the electron transport layer (i.e., the NaF layer) and the cathode. Second leftmost data in FIGS. 2 and 4 indicate, respectively, an exemplary maximum value of an electron current amount and an exemplary voltage variation amount (hereinafter, referred to as "data of Working Example") in the EOD structure. The second leftmost data in FIGS. 2 and 4 are obtained in a situation where the electron transport layer 15 and the intermediate layer 16 of the present example embodiment are provided. In the intermediate layer 16 according to Working Example, the Yb layer may be in contact with each of the electron transport layer 15 and the cathode 17. Second rightmost data in FIGS. 2 and 4 indicate, respectively, an exemplary maximum value of an electron current amount and an exemplary voltage variation amount (hereinafter, referred to as "data of Modification Example E") in the EOD structure corresponding to the modification example of the organic electroluminescent element 1 according to the present example embodiment. In the intermediate layer 16 in Modification Example E, the Yb layer may be in contact with the electron transport layer 15, and the metal-doped organic material layer may be in contact with each of the Yb layer and the cathode 17. Note that Modification Example E is mentioned again hereinafter. Further, in FIGS. 2, 3, and 4, the above-described translucent metal layer or the above-described reflective metal layer may be used for the cathode, and the NaF layer may be in contact with the organic light-emitting layer. Further, in Comparative Example 1 in FIGS. 2 and 4, the cathode is in contact with the NaF layer. In Comparative Example 2 in FIGS. 2 and 4, the cathode is in contact with the metal-doped organic material layer. In Working Example in FIGS. 2, 3, and 4, the cathode 17 is in contact with the Yb layer.

It is appreciated, from FIG. 2, that the maximum value of the electron current amount of each of Working Example and Modification Example E is larger than the maximum value of the electron current amount of Comparative Example 1. The data of Comparative Example 1 and data of each of Working Example and Modification Example E are different from each other in which of the cathode or the intermediate layer (i.e., the Yb layer) is in contact with the NaF layer. It is recognizable from this result that the contact of the intermediate layer (i.e., the Yb layer) with the NaF layer makes it possible to increase the maximum value of the electron current amount. A material having reducibility is generally more likely to react with a substance such as oxygen. However, the Yb layer having reducibility may be still relatively stable with a substance such as oxygen, thus enabling the Yb layer to react with the NaF layer without lowering reducibility. Accordingly, it is presumed that the maximum value of the electron current amount may be increased in Working Example and Modification Example E.

The data of Comparative Example 2 and data of each of Working Example and Modification Example E are different from each other in which of the metal-doped organic material layer or the Yb layer is a layer (i.e., a reduction layer) in contact with the NaF layer. The difference between the data of Comparative Example 2 and the data of each of Working Example and Modification Example E is larger than the previously mentioned difference between the data of Comparative Example 1 and the data of Working Example. This indicates that the reduction layer including the metal-doped organic material suppresses the electron current amount. The metal-doped organic material may have less amount of reducible metal and less reactivity with the NaF. Further, the organic material layer may have higher permeability for a substance such as oxygen than the metal layer. It is presumed from the characteristics that reduced Na or metal degradation may be a factor that causes the lowered electron current amount. Comparative Example 2 and Modification Example E are in common in that the metal-doped layer and the cathode are in contact with each other. It is recognizable from this respect that the contact of the Yb layer with the NaF layer on side of the cathode contributes significantly to increased electron current amount.

There may be a case where thicknesses of respective layers of the organic electroluminescent element are designed to allow the organic electroluminescent element to have the microcavity structure. In a case where an adoptable thickness of a layer to be used for electron injection or electron transport is specified within a predetermined range by the above-described design, an adjustment width of the electron current amount may be specified in accordance with the adoptable thickness of the layer to be used for electron injection or electron transport. At this occasion, as illustrated in the data of Comparative Examples 1 and 2 in FIG. 2, for example, in a case where the maximum value of the electron current amount is smaller, the adjustment width of the electron current amount may be smaller, thus leading to a possibility that it may be difficult to design the electron current amount to a desired value. Meanwhile, as illustrated in the data of Working Example in FIGS. 2 and 3 as well as the data of Modification Example E in FIG. 2, in a case where the maximum value of the electron current amount is larger, the adjustment width of the electron current amount may be increased, thus facilitating setting of the electron current amount to a desired value.

It is known, for example, that efficiency characteristics are significantly influenced by a balance between a hole current amount and the electron current amount. Further, from the viewpoint of reduction in electric power consumption, it is important to supply as much hole current and as much electron current as possible in a well-balanced manner, because reduction in a drive voltage leads to the reduction in electric power consumption. One reason for this is that the supply of the hole current and the electron current in a well-balanced manner allows for increased number of recombinations of holes and electrons, thus making it possible to achieve the reduction in the drive voltage in addition to enhanced efficiency. From this point of view, It is recognizable that there is a quite large possibility of reducing the electric power consumption in Working Example and Modification Example E, because the data of each of Working Example and Modification Example E exhibit a larger maximum value of the electron current amount than that of each of Comparative Examples 1 and 2 in FIG. 2.

Further, it is appreciated, from FIG. 3, for example, that setting a thickness of the electron transport layer 15 within a range from 0.1 nm to 20 nm makes it possible to adjust the electron current amount. It is appreciated, from FIG. 3, that, in a case where the electron current amount is desired to be suppressed to about half the maximum value or less, it is sufficient that the thickness of the electron transport layer 15 may be set within a range from 0.1 nm to 1 nm, or within a range from 15 nm to 20 nm. Note that, in a case where the thickness of the electron transport layer 15 is set within the range from 0.1 nm to 1 nm, it is possible to enhance translucency. Further, in a case where the thickness of the electron transport layer 15 is set within the range from 15 nm to 20 nm, there is a large adjustment width of the thickness of the electron transport layer 15, thus making it possible to increase a process margin. Furthermore, setting the thickness of the electron transport layer 15 within the range from 0.1 nm to 1 nm, or within the range from 15 nm to 20 nm makes it possible to suppress the electron current amount. As described in JP-A No. 2017-022369, in a case where, electron mobility is higher than hole mobility in a light-emitting layer, distribution of recombination exhibits a sharp peak near an interface between a hole transport layer and the light-emitting layer. In this case, suppression in the electron current amount makes it possible to suppress localization of light emission in the light-emitting layer, thus allowing for a longer service life. Accordingly, it is possible for Working Example and Modification Example E to improve the light emission characteristics and the service life of the organic electroluminescent element 1 more easily than Comparative Examples 1 and 2.

Further, it is appreciated, from FIG. 4, that the voltage variation amount in the data of each of Comparative Example 1, Working Example, and Modification Example E is smaller than the voltage variation amount in Comparative Example 2. This result is considered to suggest that higher stability is exhibited in the case where the reduction layer for the NaF layer is metal in the intermediate layer (i.e., the Yb layer) or metal in the cathode than the case where the reduction layer for the NaF layer is the metal-doped organic material layer. This is considered to be caused by larger influence of a smaller amount of dissociated Na on the degradation due to weaker reactivity with NaF as well as higher permeability of a substance such as oxygen in the case of the metal-doped organic material layer, as being associated also with observation on a maximum electron current amount. The Modification Example E, in which the metal-doped organic material layer may be in contact with the cathode as in Comparative Example 2, still exhibits a smaller voltage variation. It is also appreciated, from this result that, the intermediate layer (i.e., the Yb layer) in contact with the NaF layer makes it possible to exhibit enhancement in characteristics. Hence, the embodiments of the data of Working Example and Modification Example E make it possible to improve the service life because of higher stability in electrical conductivity than that of Comparative Example 2.

In the technique described in JP-A No. 2012-059709, it is appreciated, from Table 1, that characteristics vary significantly depending on material types of a first layer, and that there are also material types with low characteristics. Further, it is appreciated, from Table 1, that the characteristics vary significantly also depending on halogen types of the first layer, and that there are also materials with low characteristics. It is appreciated, from Table 1, that the characteristics become favorable when using lithium fluoride (LiF) for the first layer, whereas the characteristics become poor when using magnesium fluoride (MgF) for the first layer. JP-A No. 2012-059709, however, fails to disclose whether the characteristics become favorable when using NaF for the first layer.

In metal of first and second groups, a work function value varies significantly depending on metals. In a case where beryllium (Be) having a work function value equal to 4.98 or Mg having a work function value equal to 3.66 is used for the electron injection layer, an electron injection barrier is considered to become larger due to the large work function, thus deteriorating the characteristics, regardless of magnitude of a molecular weight. Actually, it is appreciated, from FIG. 5C of JP-A No. 2012-059709, that an applied voltage becomes higher in a case of using MgF for the first layer. In other words, it is appreciated, also from JP-A No. 2012-059709, that not every metal of the first and second groups is able to be used for the first layer.

Further, JP-A No. 2012-059709 discloses, in paragraph 0044, that calcium (Ca) is used for the first layer, LiF is used for a second layer, and Al is used for a third layer. In addition, JP-A No. 2012-059709 discloses, in paragraph 0018, that, in a case where an electrode that possibly has translucency is used as an anode electrode, it is possible to form the anode electrode by tin oxide (TO), indium tin oxide (ITO), or gold (Au). However, in a case where Ca is used for the first layer, LiF is used for the second layer, and tin oxide (TO), indium tin oxide (ITO), or gold (Au) is used for the third layer, the applied voltage becomes higher due to irreducibility of LiF unlike Al, thus it is obvious that the characteristics are poor. In other words, it is appreciated, also from JP-A No. 2012-059709, that not every metal having a work function of 3.5 eV or more is able to be used for the third layer because of compatibility between a material of the third layer and a material of the second layer.

Figure 9:
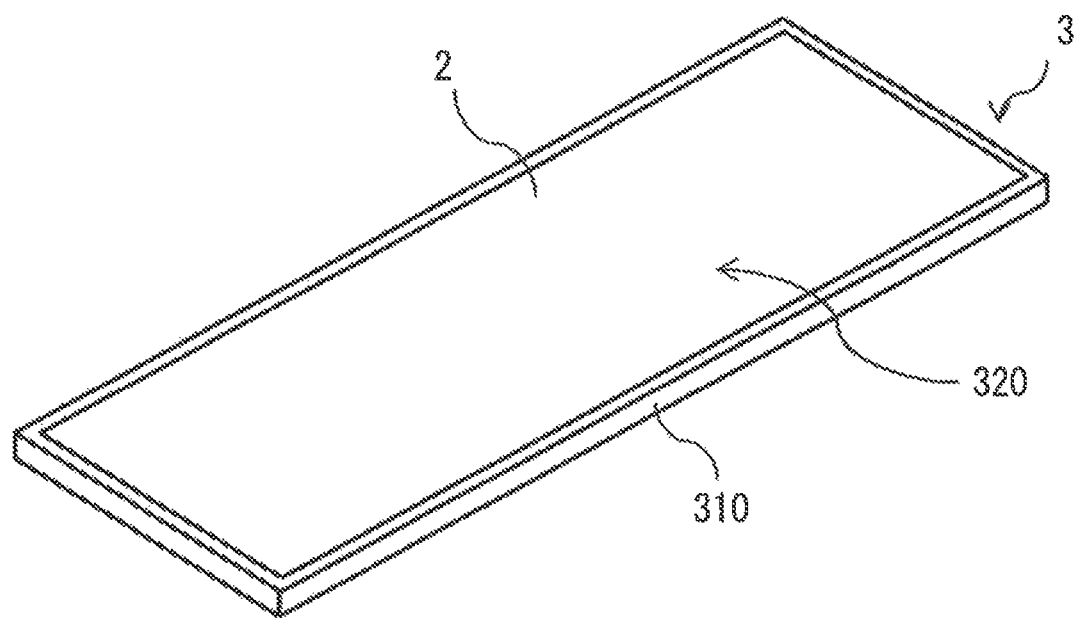
FIG. 9 is a perspective view of an appearance of an electronic apparatus provided with an organic electroluminescent unit according to one embodiment of the disclosure.

Moreover, in JP-A No. 2012-059709, a film thickness of the first layer is defined; the film thickness is illustrated in FIG. 9 of JP-A No. 2012-059709. FIG. 9 of JP-A No. 2012-059709 involves a precondition that LiF is used for the first layer, Ca is used for the second layer, and Al is used for the third layer. In a graph for BLUE in FIG. 7 of JP-A No. 2012-059709, in a case of the configuration in which LiF is used for the first layer, Ca is used for the second layer, and Al is used for the third layer, a maximum output value does not amount to 2.5 Lm/w, and remains at about 1 Lm/w. That is, it is presumed that FIG. 9 of JP-A No. 2012-059709 does not indicate the BLUE device. Likewise, in a graph for RED in FIG. 7 of JP-A No. 2012-059709, in a case of the configuration in which LiF is used for the first layer, Ca is used for the second layer, and Al is used for the third layer, a maximum output value does not amount to 2.5 Lm/w, and remains at about 0.5 Lm/w. That is, it is presumed that FIG. 9 of JP-A No. 2012-059709 does not indicate the RED device, either. It is highly possible that FIG. 9 of JP-A No. 2012-059709 indicates a GREEN device. Suppose that FIG. 9 of JP-A No. 2012-059709 indicates the GREEN device, however, characteristics illustrated in FIG. 9 of JP-A No. 2012-059709 are very low, on the contrary, because a graph for GREEN in FIG. 7 of JP-A No. 2012-059709 indicates that the output is at 20 Lm/w. Whatever the case may be, credibility of the data is low, thus it is obvious that grounds for definition of the film thickness of LiF are weak.

Meanwhile, the present example embodiment has the configuration in which the NaF layer is used for the electron transport layer 15; the electron transport layer 15 (i.e., the NaF layer) may be in contact with the organic light-emitting layer 14; the Yb layer that is in contact with the NaF layer is used for the intermediate layer 16; the above-described translucent metal layer or the above-described reflective metal layer may be used for the cathode 17; and the cathode 17 may be in contact with the intermediate layer 16 (i.e., the Yb layer). This configuration makes it possible, for example, to easily improve the light emission characteristics of the organic electroluminescent element 1, and to improve the service life thereof, as appreciated also from FIGS. 2, 3, and 4.

2. Modification Examples of First Embodiment

In the foregoing example embodiment, the intermediate layer 16 may include a certain functional layer, in addition to the Yb layer. In particular, in a case where the organic electroluminescent element 1 has the top emission structure, the intermediate layer 16 may include, in addition to the Yb layer, various layers as illustrated in Modification Examples A, B, C, D, E, F, and G of FIGS. 5 and 6, for example.

Modification Example A

In the present modification example, the intermediate layer 16 may include, in addition to the above-described Yb layer (hereinafter, referred to as a "Yb layer 16A"), a film thickness adjusting layer 16B, for example. The film thickness adjusting layer 16B may be provided at the Yb layer 16A on the side of the cathode 17, and may include a transparent electrically-conductive material. The film thickness adjusting layer 16B may adjust, for example, the distance from the anode 11 to the cathode 17 to a predetermined optical path length. The film thickness adjusting layer 16B may be configured, for example, by the transparent electrically-conductive material such as ITO and IZO. The film thickness adjusting layer 16B may be an ITO layer or an IZO layer, for example. The ITO layer or the IZO layer used for the film thickness adjusting layer 16B may have a film thickness of more than 40 nm, for example. Note that, in the present modification example, the Yb layer 16A may serve to suppress occurrence of damage to layers such as the electron transport layer 15 (i.e., the NaF layer) and the Yb layer 16A upon formation of the film thickness adjusting layer 16B by means of a sputtering method. In this case, the Yb layer 16A may have a film thickness of more than 1 nm, for example.

The present modification example has the configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B being interposed therebetween. This configuration makes it possible, similarly to the foregoing example embodiment, to easily improve the light emission characteristics of the organic electroluminescent element 1, and to improve the service life thereof. Note that, in the present modification example, adjusting the film thickness of the Yb layer 16A using, for example, a film forming device and a film forming process for the film thickness adjusting layer 16B and a film thickness of the film thickness adjusting layer 16B makes it possible to obtain effects similar to those of Working Example illustrated in FIGS. 2, 3, and 4.

Modification Example B

In the present modification example, the intermediate layer 16 may include, in addition to the Yb layer 16A and the film thickness adjusting layer 16B, for example, an Ag underlayer 16C that is in contact with the film thickness adjusting layer 16B on side of the electron transport layer 15. In a specific but non-limiting example, the Ag underlayer 16C may be provided between the Yb layer 16A and the film thickness adjusting layer 16B, and may be in contact with each of the Yb layer 16A and the film thickness adjusting layer 16B. The Ag underlayer 16C suppresses occurrence of damage to layers such as the electron transport layer 15 (i.e., the NaF layer) and the Yb layer 16A upon formation of the film thickness adjusting layer 16B by means of a sputtering method. The Ag underlayer 16C may be configured by Ag, for example. An Ag layer used for the Ag underlayer 16C may have a film thickness in a range from 0.1 nm to 10 nm, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B and the Ag underlayer 16C being interposed therebetween. This configuration makes it possible, similarly to the foregoing example embodiment, to easily improve the light emission characteristics of the organic electroluminescent element 1, and to improve the service life thereof. Adjusting the film thickness of the Ag underlayer 16C using, for example, the film forming device and the film forming process for the film thickness adjusting layer 16B and the film thickness of the film thickness adjusting layer 16B makes it possible to obtain effects similar to those of Working Example illustrated in FIGS. 2, 3, and 4.

Modification Example C

In the present modification example, the intermediate layer 16 may include, in addition to the Yb layer 16A, the film thickness adjusting layer 16B, and the Ag underlayer 16C, for example, a Yb film quality adjusting layer 16D that is provided at the film thickness adjusting layer 16B on the side of the cathode 17. In a specific but non-limiting example, the Yb film quality adjusting layer 16D may be provided between the film thickness adjusting layer 16B and the cathode 17, and may be in contact with each of the film thickness adjusting layer 16B and the cathode 17. The Yb film quality adjusting layer 16D may be an underlayer that suppresses deterioration of film quality of the cathode 17 at an occasion where the cathode 17 is formed to be thin. The Yb film quality adjusting layer 16D may be configured by Yb, for example. A Yb layer used for the Yb film quality adjusting layer 16D may have a film thickness in a range from 0.1 nm to 3 nm, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B, the Ag underlayer 16C, and the Yb film quality adjusting layer 16D being interposed therebetween. This configuration makes it possible, similarly to the foregoing example embodiment, to easily improve the light emission characteristics of the organic electroluminescent element 1, and to improve the service life thereof. Adjusting the film thickness of the Ag underlayer 16C using, for example, the film forming device and the film forming process for the film thickness adjusting layer 16B and the film thickness of the film thickness adjusting layer 16B makes it possible to obtain effects similar to those of Working Example illustrated in FIGS. 2, 3, and 4.

Modification Example D

In the foregoing Modification Example C, for example, the Ag underlayer 16C may be omitted. In this case, however, the Yb layer 16A may serve to suppress occurrence of damage to layers such as the electron transport layer 15 (i.e., the NaF layer) and the Yb layer 16A upon formation of the film thickness adjusting layer 16B by means of a sputtering method. In this case, the Yb layer 16A may have a film thickness of more than 1 nm, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B and the Yb film quality adjusting layer 16D being interposed therebetween. This configuration makes it possible, similarly to the foregoing example embodiment, to easily improve the light emission characteristics of the organic electroluminescent element 1, and to improve the service life thereof. Adjusting the film thickness of the Yb layer 16A using, for example, the film forming device and the film forming process for the film thickness adjusting layer 16B and the film thickness of the film thickness adjusting layer 16B makes it possible to obtain effects similar to those of Working Example illustrated in FIGS. 2, 3, and 4.

Modification Example E

In the present modification example, the intermediate layer 16 may include, in addition to the Yb layer 16A, a metal-doped organic material layer (hereinafter, referred to as "metal-doped organic material layer 16E"), for example. In a specific but non-limiting example, the metal-doped organic material layer 16E may be provided between the Yb layer 16A and the cathode 17, and may be in contact with each of the Yb layer 16A and the cathode 17. The metal doped into the metal-doped organic material layer 16E may include Yb, for example. The metal-doped organic material layer 16E may have a film thickness in a range from 5 nm to 50 nm, for example. The metal-doped organic material layer 16E may have a metal doping concentration in a range from 5 wt % to 60 wt %, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the metal-doped organic material layer 16E being interposed therebetween. This configuration makes it possible, similarly to the foregoing example embodiment, to easily improve the light emission characteristics of the organic electroluminescent element 1, and to improve the service life thereof.

Modification Example F

In the present modification example, the intermediate layer 16 may include, in addition to the Yb layer 16A and the film thickness adjusting layer 16B, for example, the metal-doped organic material layer 16E that is in contact with the film thickness adjusting layer 16B on the side of the electron transport layer 15. In the present modification example, the metal-doped organic material layer 16E may be provided between the Yb layer 16A and the film thickness adjusting layer 16B, and may be in contact with each of the Yb layer 16A and the film thickness adjusting layer 16B, in a specific but non-limiting example. The metal-doped organic material layer 16E may suppress occurrence of damage to layers such as the electron transport layer 15 (i.e., the NaF layer) and the Yb layer 16A upon formation of the film thickness adjusting layer 16B by means of a sputtering method. The metal doped into the metal-doped organic material layer 16E may include Yb, for example. The metal-doped organic material layer 16E may have a film thickness in a range from 5 nm to 50 nm, for example. The metal-doped organic material layer 16E may have a metal doping concentration in a range from 5 wt % to 60 wt %, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B and the metal-doped organic material layer 16E being interposed therebetween. This configuration makes it possible, similarly to the foregoing example embodiment, to easily improve the light emission characteristics of the organic electroluminescent element 1, and to improve the service life thereof. Adjusting the film thickness of the metal-doped organic material layer 16E using, for example, the film forming device and the film forming process for the film thickness adjusting layer 16B and the film thickness of the film thickness adjusting layer 16B makes it possible to obtain effects similar to those of Modification Example E illustrated in FIGS. 2 and 4.

Modification Example G

In the present modification example, the intermediate layer 16 may include, in addition to the Yb layer 16A, the film thickness adjusting layer 16B, and the Yb film quality adjusting layer 16D, for example, the metal-doped organic material layer 16E that is in contact with the film thickness adjusting layer 16B on the side of the electron transport layer 15. In the present modification example, the metal-doped organic material layer 16E may be provided between the Yb layer 16A and the film thickness adjusting layer 16B, and may be in contact with each of the Yb layer 16A and the film thickness adjusting layer 16B, in a specific but non-limiting example. The metal-doped organic material layer 16E may suppress occurrence of damage to layers such as the electron transport layer 15 (i.e., the NaF layer) and the Yb layer 16A upon formation of the film thickness adjusting layer 16B by means of a sputtering method. The metal doped into the metal-doped organic material layer 16E may include Yb, for example. The metal-doped organic material layer 16E may have a film thickness in a range from 5 nm to 50 nm, for example. The metal-doped organic material layer 16E may have a metal doping concentration in a range from 5 wt % to 60 wt %, for example.

The present modification example has a configuration in which the NaF layer is used for the electron transport layer 15; the electron transport layer 15 (i.e., the NaF layer) may be in contact with the organic light-emitting layer 14; the Yb layer that is in contact with the NaF layer is included in the intermediate layer 16; the above-described translucent metal layer or the above-described reflective metal layer may be used for the cathode 17; and the cathode 17 may be in contact with the Yb layer 16A with the film thickness adjusting layer 16B, the metal-doped organic material layer 16E, and the Yb film quality adjusting layer 16D being interposed therebetween. This configuration makes it possible, similarly to the foregoing example embodiment, to easily improve the light emission characteristics of the organic electroluminescent element 1, and to improve the service life thereof. Adjusting the film thickness of the metal-doped organic material layer 16E using, for example, the film forming device and the film forming process for the film thickness adjusting layer 16B and the film thickness of the film thickness adjusting layer 16B makes it possible to obtain effects similar to those of Modification Example E illustrated in FIGS. 2 and 4.

Modification Example H

In the foregoing example embodiment and Modification Examples A, B, C, D, E, F, and G, the cathode 17 may include a Yb cap layer 17C that is in contact with the above-described translucent metal layer (hereinafter, referred to as a "translucent metal layer 17A") or the above-described reflective metal layer (hereinafter, referred to as a "reflective metal layer 17B") on side opposite to the electron transport layer 15. At an occasion where the translucent metal layer 17A or the reflective metal layer 17B is formed to be thin, the translucent metal layer 17A and the reflective metal layer 17B may each have a high resistance value in some cases. In such cases, the Yb cap layer 17C may serve as a low resistance layer that lowers the resistance value of the cathode 17. The Yb cap layer 17C may be configured by Yb, for example. A Yb layer used for the Yb cap layer 17C may have a film thickness in a range from 0.1 nm to 5 nm, for example.

The present modification example has a configuration in which the NaF layer is used for the electron transport layer 15; the electron transport layer 15 (i.e., the NaF layer) may be in contact with the organic light-emitting layer 14; the Yb layer is used for the intermediate layer 16; and the above-described translucent metal layer or the above-described reflective metal layer may be used for the cathode 17; and the Yb cap layer 17C that lowers the resistance of the cathode 17 may also be used for the cathode 17. This configuration makes it possible, similarly to the foregoing example embodiment, to easily improve the light emission characteristics of the organic electroluminescent element 1, and to improve the service life thereof.

3. Second Embodiment

Figure 7:
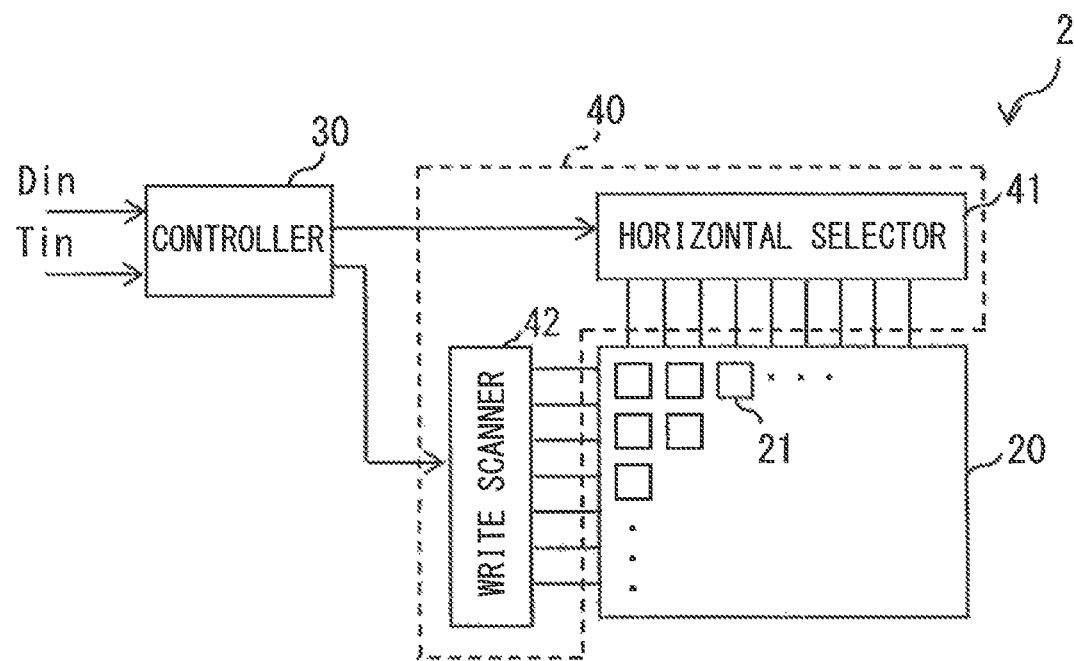
FIG. 7 illustrates an exemplary outline configuration of an organic electroluminescent unit according to one embodiment of the disclosure.
Figure 8:
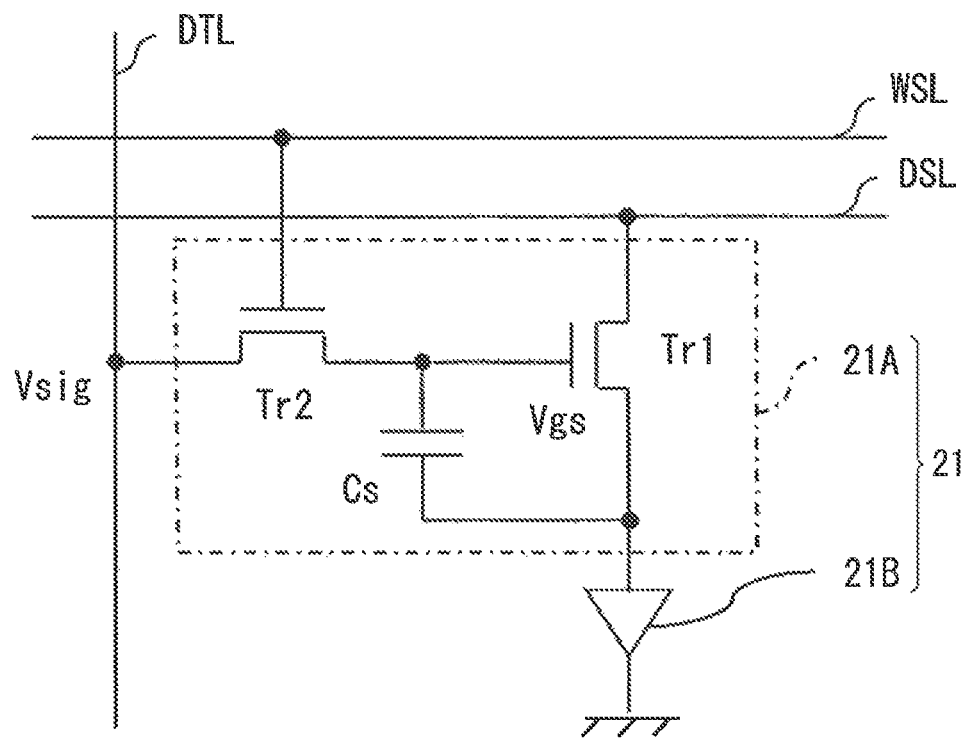
FIG. 8 illustrates an exemplary circuit configuration of a pixel illustrated in FIG. 7.

[Configuration]
FIG. 7 illustrates an exemplary outline configuration of an organic electroluminescent unit 2 according to a second embodiment of the disclosure. FIG. 8 illustrates an exemplary circuit configuration of a pixel 21 in the organic electroluminescent unit 2. The organic electroluminescent unit 2 may include, for example, a display panel 20, a controller 30, and a driver 40. The driver 40 may be mounted on an outer edge portion of the display panel 20. The display panel 20 may include a plurality of pixels 21 arranged in matrix. The controller 30 and the driver 40 may drive the display panel 20 on the basis of an image signal Din and a synchronizing signal Tin received from an external device.

[Display Panel 20]
In response to active-matrix driving of the pixels 21 performed by the controller 30 and the driver 40, the display panel 20 may display an image based on the image signal Din and the synchronizing signal Tin received from the external device. The display panel 20 may include a plurality of scanning lines WSL and a plurality of power lines DSL both extending in a row direction, a plurality of signal lines DTL extending in a column direction, and the plurality of pixels 21 arranged in matrix.

The scanning lines WSL may be used to select the pixels 21. The scanning lines WSL may supply a selection pulse to the pixels 21 to select the pixels 21 on a predetermined unit basis. For example, the pixels 21 may be selected on a pixel-row basis. The signal lines DTL may supply, to each of the pixels 21, a signal voltage Vsig corresponding to the image signal Din. The signal lines DTL may supply, to each of the pixels 21, a data pulse including the signal voltage Vsig. The power lines DSL may supply electric power to the pixels 21.

The plurality of pixels 21 may include ones emitting red light, ones emitting green light, and ones emitting blue light, for example. Note that the pixels 21 may further include ones emitting light of another color, such as white or yellow.

The signal lines DTL may be each coupled to an output end of a horizontal selector 41 described later. Each of the signal lines DTL may be assigned to a corresponding pixel column, for example. The scanning lines WSL may be each coupled to an output end of a write scanner 42 described later. Each of the scanning lines WSL may be assigned to a corresponding pixel row, for example. The power lines DSL may be each coupled to an output end of a power supply. Each of the power lines DSL may be assigned to a corresponding pixel row, for example.

The pixels 21 may each include, for example, a pixel circuit 21A and an organic electroluminescent element 21B. The organic electroluminescent element 21B may be, for example, the organic electroluminescent element 1 according to any of the foregoing example embodiments and Modification Examples A to H. One or more of the pixels 21 in the display panel 20 may include the organic electroluminescent element 1 according to any of the foregoing example embodiments and Modification Examples A to H. In other words, one or more of the organic electroluminescent elements 21B in the display panel 20 may be the organic electroluminescent element 1 according to any of the foregoing example embodiments and Modification Examples A to H.

The pixel circuit 21A may control light emission and light extinction of the organic electroluminescent element 21B. The pixel circuit 21A may serve to retain a voltage written into the corresponding pixel 21 through write scanning described later. The pixel circuit 21A may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may be based on the image signal Din. In a specific but non-limiting example, the switching transistor Tr2 may sample a voltage of the signal line DTL and write the sampled voltage into the gate of the driving transistor Tr1. The driving transistor Tr1 may be coupled in series to the organic electroluminescent element 21B. The driving transistor Tr1 may drive the organic electroluminescent element 21B. The driving transistor Tr1 may control an electric current flowing through the organic electroluminescent element 21B on the basis of the magnitude of the voltage sampled at the switching transistor Tr2. The storage capacitor Cs may retain a predetermined voltage between the gate and a source of the driving transistor Tr1. The storage capacitor Cs may serve to retain a gate-source voltage Vgs of the driving transistor Tr1 at a constant level for a predetermined period. Note that the pixel circuit 21A may have a circuit configuration that includes the 2Tr1C circuit described above and additional capacitors and transistors. In an alternative embodiment, the pixel circuit 21A may have a circuit configuration different from that of the 2Tr1C circuit described above.

Each of the signal lines DTL may be coupled to an output end of the horizontal selector 41 described later and a source or a drain of the switching transistor Tr2. Each of the scanning lines WSL may be coupled to an output end of the write scanner 42 described later and a gate of the switching transistor Tr2. Each of the power lines DSL may be coupled to an output end of a power supply circuit 33 and the source or a drain of the driving transistor Tr1.

The gate of the switching transistor Tr2 may be coupled to the corresponding scanning line WSL. One of the source and the drain of the switching transistor Tr2 may be coupled to the corresponding signal line DTL. A terminal of the source and the drain of the switching transistor Tr2, which is not coupled to the signal line DTL, may be coupled to the gate of the driving transistor Tr1. One of the source and the drain of the driving transistor Tr1 may be coupled to the corresponding power line DSL. A terminal of the source and the drain of the driving transistor Tr1, which is not coupled to the power line DSL, may be coupled to the anode 11 of the organic electroluminescent element 21B. One end of the storage capacitor Cs may be coupled to the gate of the driving transistor Tr1. The other end of the storage capacitor Cs may be coupled to a terminal, on side of the organic electroluminescent element 21B, of the source and the drain of the driving transistor Tr1.

[Driver 40]

The driver 40 may include the horizontal selector 41 and the write scanner 42, for example. The horizontal selector 41 may apply the analog signal voltage Vsig to each of the signal lines DTL, in response to or in synchronization with an input of a control signal, for example. The analog signal voltage Vsig may be transmitted from the controller 30. The write scanner 42 may scan the pixels 21 on a predetermined unit basis.

[Controller 30]

The controller 30 is described below. The controller 30 may perform predetermined correction on the digital image signal Din and generate the signal voltage Vsig on the basis of the image signal obtained through the predetermined correction, for example. The image signal Din may be transmitted from an external device, for example. The controller 30 may output the generated signal voltage Vsig to the horizontal selector 41, for example. The controller 30 may transmit a control signal to each circuit in the driver 40, in response to or in synchronization with the synchronizing signal Tin. The synchronizing signal may be transmitted from an external device, for example.

[Effects]

In one embodiment of the disclosure, one or more of the organic electroluminescent elements 21B in the display panel 20 may be the organic electroluminescent element 1 according to any of the foregoing example embodiments and Modification Examples A to H. Hence, it is possible to achieve the organic electroluminescent unit 2 that is superior in the light emission characteristics and has a long service life.

4. Application Examples

Application Example 1

Described later is an application example of the organic electroluminescent unit 2 of the foregoing second embodiment. The organic electroluminescent unit 2 is applicable to a variety of display units of electronic apparatuses that display, as images or pictures, image signals received from external devices or generated inside the display units. Non-limiting examples of the electronic apparatuses may include televisions, digital cameras, notebook personal computers, sheet-like personal computers, portable terminal devices such as mobile phones, and video cameras.

FIG. 9 is a perspective view of an appearance of an electronic apparatus 3 of the present application example. The electronic apparatus 3 may be, for example, a sheet-like personal computer including a body 310 having a display surface 320 on a main face. The organic electroluminescent unit 2 may be provided on the display surface 320 of the electronic apparatus 3. The organic electroluminescent unit 2 may be disposed such that the display panel 20 faces outward. In the present application example, the organic electroluminescent unit 2 provided on the display surface 320 makes it possible to achieve the electronic apparatus 3 that is superior in the light emission characteristics and has a long service life.

Application Example 2

Described later is an application example of the organic electroluminescent element 1 according to any of the foregoing example embodiments and Modification Examples A to H. The organic electroluminescent element 1 is applicable to a variety of light sources for illumination apparatuses, such as illumination apparatuses for table lighting or floor lighting, and illumination apparatuses for room lighting.

Figure 10:
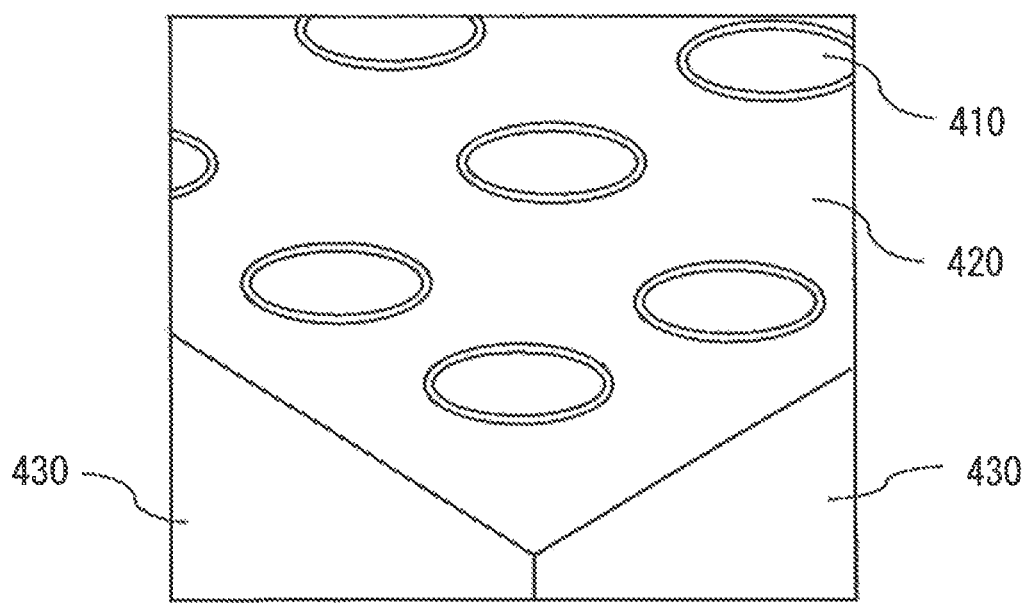
FIG. 10 is a perspective view of an appearance of an illumination apparatus provided with an organic electroluminescent element according to one embodiment of the disclosure.

FIG. 10 illustrates an appearance of an illumination apparatus for room lighting to which the organic electroluminescent element 1 according to any of the foregoing example embodiments and Modification Examples A to H is applied. The illumination apparatus may include, for example, illuminating sections 410 each including one or a plurality of the organic electroluminescent elements 1 according to any of the foregoing example embodiments and Modification Examples A to H. An appropriate number of the illuminating sections 410 may be disposed at appropriate intervals on a ceiling 420 of a building. Note that the illuminating sections 410 may be installed on any place other than the ceiling 420, such as a wall 430 or an unillustrated floor, depending on the intended use.

The illumination apparatus may perform illumination with light outputted from the organic electroluminescent elements 1 according to any of the foregoing example embodiments and Modification Examples A to H. This makes it possible to achieve an illumination apparatus that is superior in the light emission characteristics and has a long service life.

Although the disclosure has been described hereinabove with reference to the example embodiments and the application examples, the disclosure is not limited thereto, but may be modified in a wide variety of ways. Note that the effects described hereinabove are mere examples. The effects according to an embodiment of the disclosure are not limited to those described hereinabove. The disclosure may further include other effects in addition to the effects described hereinabove.

Moreover, the disclosure may have the following configurations, for example.

(1)

An organic electroluminescent element including, in order:
an anode;
an organic light-emitting layer;
an electron transport layer including a sodium fluoride layer;
an intermediate layer including an ytterbium layer; and
a cathode,
the ytterbium layer being in contact with the sodium fluoride layer on side of the cathode.

(2)

The organic electroluminescent element according to (1), in which the sodium fluoride layer is in contact with the organic light-emitting layer.

(3)

The organic electroluminescent element according to (1) or (2), in which
a distance from the anode to the cathode is an optical length in which a cavity is generated, and
the cathode includes a translucent metal layer or a reflective metal layer at an interface on side of the electron transport layer.

(4)

The organic electroluminescent element according to any one of (1) to (3), in which the cathode is in contact with the ytterbium layer.

(5)

The organic electroluminescent element according to (3), in which the intermediate layer includes a film thickness adjusting layer provided at the ytterbium layer on the side of the cathode, the film thickness adjusting layer including a transparent electrically-conductive material.

(6)

The organic electroluminescent element according to (5), in which the intermediate layer includes a silver underlayer that is in contact with the film thickness adjusting layer on the side of the electron transport layer.

(7)

The organic electroluminescent element according to (6), in which the intermediate layer includes an ytterbium film quality adjusting layer provided at the film thickness adjusting layer on the side of the cathode.

(8)

The organic electroluminescent element according to (5), in which the intermediate layer includes an ytterbium film quality adjusting layer provided at the film thickness adjusting layer on the side of the cathode.

(9)

The organic electroluminescent element according to any one of (1) to (3), in which the intermediate layer includes a metal-doped organic material layer provided at the ytterbium layer on the side of the cathode.

(10)

The organic electroluminescent element according to (9), in which the intermediate layer includes a film thickness adjusting layer provided at the metal-doped organic material layer on the side of the cathode, the film thickness adjusting layer including a transparent electrically-conductive material.

(11)

The organic electroluminescent element according to (10), in which the intermediate layer includes an ytterbium film quality adjusting layer provided at the film thickness adjusting layer on the side of the cathode.

(12)

The organic electroluminescent element according to any one of (4) to (11), in which the cathode includes an ytterbium cap layer that is in contact with the translucent metal layer or the reflective metal layer on side opposite to the electron transport layer.

(13)

The organic electroluminescent element according to any one of (1) to (12), in which the ytterbium layer has a thickness in a range from 0.1 nm to 10 nm.

(14)

The organic electroluminescent element according to any one of (1) to (13), in which the sodium fluoride layer has a thickness in a range from 0.1 nm to 20 nm.

(15)

The organic electroluminescent element according to (14), in which the sodium fluoride layer has a thickness in a range from 0.1 nm to 1 nm.

(16)

The organic electroluminescent element according to (14), in which the sodium fluoride layer has a thickness in a range from 15 nm to 20 nm.

(17)

The organic electroluminescent element according to any one of (9) to (12), in which metal of the metal-doped organic material layer includes ytterbium.

(18)

An organic electroluminescent unit including a plurality of organic electroluminescent elements,
one or more of the organic electroluminescent elements including, in order
an anode,
an organic light-emitting layer,
an electron transport layer including a sodium fluoride layer,
an intermediate layer including an ytterbium layer, and
a cathode,
the ytterbium layer being in contact with the sodium fluoride layer on side of the cathode.

(19)

An electronic apparatus including an organic electroluminescent unit that includes a plurality of organic electroluminescent elements,
one or more of the organic electroluminescent elements including, in order
an anode,
an organic light-emitting layer,
an electron transport layer including a sodium fluoride layer,
an intermediate layer including an ytterbium layer, and
a cathode,
the ytterbium layer being in contact with the sodium fluoride layer on side of the cathode.

According to the organic electroluminescent element, the organic electroluminescent unit, and the electronic apparatus of one embodiment of the disclosure, there is provided, between the organic light-emitting layer and the cathode, a laminated body in which the sodium fluoride layer and the ytterbium layer that are in contact with each other are laminated in this order from the side of the organic light-emitting layer. Hence, it becomes possible to improve the light emission characteristics and the service life of the organic electroluminescent element. Note that the description hereinabove is merely exemplified. The effects of the disclosure are not limited to those described hereinabove. The disclosure may include some effects different from those described hereinabove and may further include additional effects.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. An organic electroluminescent element comprising, in order:
   an anode;
   an organic light-emitting layer,
   an electron transport layer including a sodium fluoride layer, wherein the electron transport layer is in direct physical contact with the organic light-emitting layer,
   an intermediate multilayer comprising a plurality of layers, including an ytterbium layer;
   a cathode multilayer;
   the ytterbium layer being in contact with the sodium fluoride layer on side of the cathode multilayer;
   a distance from the anode to the cathode multilayer is an optical length in which a cavity is generated, and
   the cathode multilayer includes a translucent metal layer or a reflective metal layer at an interface on side of the electron transport layer.

2. The organic electroluminescent element according to claim 1, wherein the sodium fluoride layer is in contact with the organic light-emitting layer.

3. The organic electroluminescent element according to claim 1, wherein the cathode multilayer is in contact with the ytterbium layer.

4. The organic electroluminescent element according to claim 1, wherein the intermediate multilayer includes a film thickness adjusting layer provided at the ytterbium layer on the side of the cathode multilayer, the film thickness adjusting layer including a transparent electrically-conductive material.

5. The organic electroluminescent element according to claim 4, wherein the intermediate multilayer includes a silver underlayer that is in contact with the film thickness adjusting layer on the side of the electron transport layer.

6. The organic electroluminescent element according to claim 5, wherein the intermediate multilayer includes an ytterbium film quality adjusting layer provided at the film thickness adjusting layer on the side of the cathode multilayer.

7. The organic electroluminescent element according to claim 4, wherein the intermediate multilayer includes an ytterbium film quality adjusting layer provided at the film thickness adjusting layer on the side of the cathode multilayer.

8. The organic electroluminescent element according to claim 3, wherein the cathode multilayer includes an ytterbium cap layer that is in contact with the translucent metal layer or the reflective metal layer on side opposite to the electron transport layer.

9. The organic electroluminescent element according to claim 1, wherein the ytterbium layer has a thickness in a range from 0.1 nm to 10 nm.

10. The organic electroluminescent element according to claim 1, wherein the sodium fluoride layer has a thickness in a range from 0.1 nm to 20 nm.

11. The organic electroluminescent element according to claim 10, wherein the sodium fluoride layer has a thickness in a range from 0.1 nm to 1 nm.

12. The organic electroluminescent element according to claim 10, wherein the sodium fluoride layer has a thickness in a range from 15 nm to 20 nm.

13. An organic electroluminescent unit comprising a plurality of organic electroluminescent elements,
    one or more of the organic electroluminescent elements including, in order
        an anode,
        an organic light-emitting layer,
        an electron transport layer including a sodium fluoride layer, wherein the electron transport layer is in direct physical contact with the organic light-emitting layer,
        an intermediate multilayer comprising a plurality of layers, including an ytterbium layer, and
        a cathode multilayer,
        the ytterbium layer being in contact with the sodium fluoride layer on side of the cathode multilayer,
        wherein the intermediate multilayer includes a metal-doped organic material layer provided at the ytterbium layer on the side of the cathode multilayer.

14. The organic electroluminescent element according to claim 13, wherein the intermediate multilayer includes a film thickness adjusting layer provided at the metal-doped organic material layer on the side of the cathode multilayer, the film thickness adjusting layer including a transparent electrically-conductive material.

15. The organic electroluminescent element according to claim 14, wherein the intermediate multilayer includes an ytterbium film quality adjusting layer provided at the film thickness adjusting layer on the side of the cathode multilayer.

16. The organic electroluminescent element according to claim 13, wherein metal of the metal-doped organic material layer includes ytterbium.

17. An electronic apparatus comprising an organic electroluminescent unit that includes a plurality of organic electroluminescent elements,
    one or more of the organic electroluminescent elements including, in order
        an anode,
        an organic light-emitting layer, an electron transport layer including a sodium fluoride layer, wherein the electron transport layer is in direct physical contact with the organic light-emitting layer, an intermediate multilayer comprising a plurality of layers, including an ytterbium layer, and a cathode multilayer, the ytterbium layer being in contact with the sodium fluoride layer on side of the cathode multilayer, wherein the intermediate multilayer includes a metal-doped organic material layer provided at the ytterbium layer on the side of the cathode multilayer.

* * * * *